United States Patent
Rahim et al.

(10) Patent No.: US 7,139,997 B1
(45) Date of Patent: Nov. 21, 2006

(54) METHOD AND SYSTEM FOR CHECKING OPERATION OF A MASK GENERATION ALGORITHM

(75) Inventors: Irfan Rahim, San Jose, CA (US); Bradley Jensen, San Jose, CA (US); Girish Venkitachalam, San Jose, CA (US); Hugh Sung-Ki O, Fremont, CA (US); Susan Falk, Los Altos, CA (US); Priya Selvaraj, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 118 days.

(21) Appl. No.: 10/844,034

(22) Filed: May 11, 2004

(51) Int. Cl.
*G06F 17/50* (2006.01)

(52) U.S. Cl. .......................... 716/19; 716/21
(58) Field of Classification Search ............... 716/19, 716/18; 430/5, 394, 396
See application file for complete search history.

(56) References Cited

U.S. PATENT DOCUMENTS

| | | | |
|---|---|---|---|
| 4,753,901 A * | 6/1988 | Ellsworth et al. | 438/427 |
| 5,446,836 A * | 8/1995 | Lentz et al. | 345/441 |
| 6,800,428 B1 * | 10/2004 | Okada et al. | 430/394 |

* cited by examiner

*Primary Examiner*—Sun James Lin
(74) *Attorney, Agent, or Firm*—Martine Penilla & Gencarella, LLP (57) ABSTRACT

Disclosed is a method for checking the operation of an IC mask generation algorithm in which at least a first identifier of the mask generation algorithm is associated with at least a first symbol that is not associated with generating a functional IC feature. The first symbol has a predetermined size and a predetermined shape. A predetermined location on a mask is also associated with the first symbol. A mask diagram on the mask is generated at least partially at the first predetermined location. The size and shape of the mask diagram is then compared with at least a portion of the first predetermined size and the first predetermined shape of the first symbol.

17 Claims, 5 Drawing Sheets

METHOD AND SYSTEM FOR CHECKING OPERATION OF A MASK GENERATION ALGORITHM

TECHNICAL FIELD

The present invention relates to manufacture of integrated circuits using microlithography machines. In particular, the present invention relates to checking the accuracy of masks (and the algorithms used to generate the masks) used in microlithography machines in the manufacture of integrated circuits.

BACKGROUND

As is well understood in the art, manufacture of IC circuitry involves building up layers of different materials (and sometimes implanting different species) on a wafer to form circuit features. Part of the process of forming each circuit layer involves coating the wafer with a layer of light-sensitive resist material and exposing each chip area with an image of a circuit pattern for the layer. As is well understood, this is process is carried out using a microlithography machine in which a reticle or mask containing a pattern corresponding to a circuit pattern for an IC layer is illuminated, and a projection optical system projects an image of the illuminated mask pattern onto the resist layer of the wafer. A number of masks are necessary for the manufacture of a single IC.

Accurate creation of a mask for the microlithography machine from design drawings of the mask is critical to this process. Typically, in order to create a masks from design drawings, a database that defines layers (different from physical IC layers) and data types on each layer is used. Generally, the database includes a plurality of layers each of which includes at least one, and typically more than one, data type. A single data type of a layer generally indicates one or more shapes and locations of those shapes on a two dimensional grid. In generation of a mask from the database, the location (or locations) of the shape (or shapes) associated with a particular data type are translated to a location of the shape (or shapes) on the mask. Typically, a database is populated with enough layer and data type data to generate all of the masks necessary for the manufacture of a single IC (or a family of ICs sharing similar characteristics). An algorithm is then written that transforms the layers and data types from the database into the masks necessary to create an IC. Typically, a single algorithm is written for each mask that is required for the manufacture of a single IC. The Algorithms typically involve a Boolean function on the multiple drawn layer to create a mask, and can also involve a sizing to either reduce some critical dimension or removing slivers (sub-design rule features).

After a particular mask or set of masks is generated using the database and generation algorithms, the mask or masks must be checked against the original design drawings to insure accuracy of the generated masks. This is typically done by starting with a transformation in one of the algorithms, locating in the original drawing the shape that the particular transformation is to generate in the associated mask, finding the shape in the generated mask, and checking, based on the original drawing, that it is of appropriate size and shape. This checking is not done on all the polygons in the database but just some from each of the layer/data type combinations such that all the algorithms used in the database to mask transformation are verified. This task is typically performed manually. And, as smaller and more numerous electrical devices are placed on ICs, masks for manufacturing the ICs become larger and more complex, increasing the burden of this checking task and in most cases not resulting in 100% verification of the algorithms. Such checking can require days or weeks to complete in a typical manufacturing environment. Accordingly, a more efficient method for checking the accuracy of masks for the manufacture of an IC is needed.

SUMMARY OF THE INVENTION

In an efficient method for checking the operation of an IC mask generation algorithm at least a first identifier of the mask generation algorithm is associated with at least a first symbol that is not associated with generating a functional IC feature. The first symbol has a predetermined size and a predetermined shape. A predetermined location on a mask is also associated with the first symbol. A mask diagram on the mask is generated at least partially at the first predetermined location. The size and shape of the mask diagram is then compared with at least a portion of the first predetermined size and the first predetermined shape of the first symbol.

In another aspect of the present invention, a system for efficiently checking the operation of an integrated circuit ("IC") mask generation algorithm includes first database data representing a first symbol not associated with IC functionality and at least a first identifier in the IC mask generation algorithm. The first identifier is associated with the first symbol. The system also includes a checking diagram generated by the algorithm at a first predetermined location on a mask from at least a portion of the first symbol. To check the operation of the algorithm, a size and shape of at least a portion of the mask diagram is compared with a size and shape of the first symbol.

DETAILED DESCRIPTION

Figure 1:
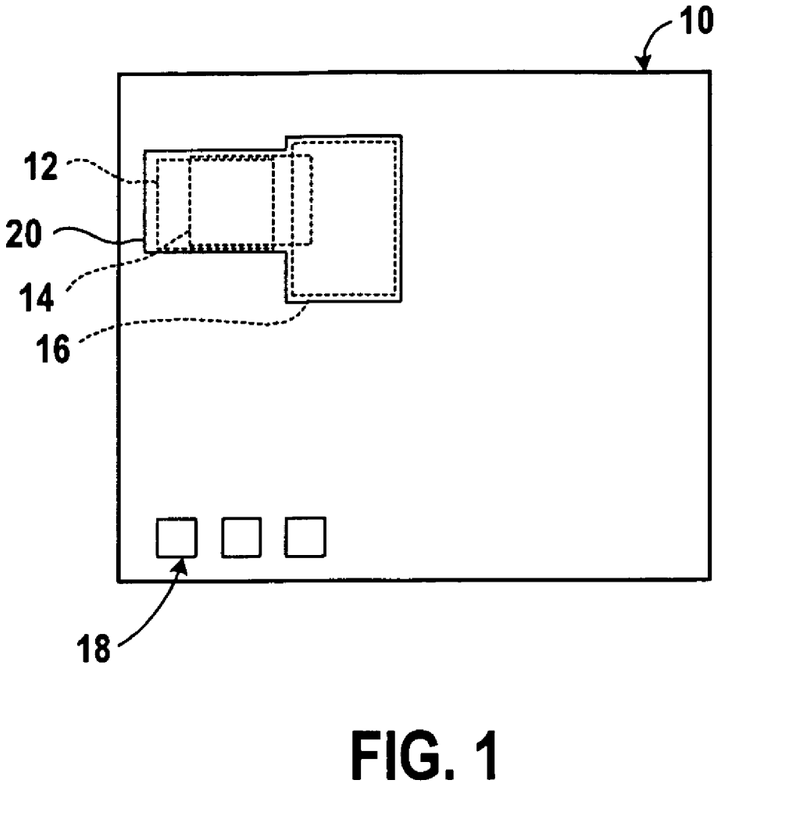
FIG. 1 is a block diagram illustrating an IC mask including a checking diagram in accordance with the present invention.

FIG. 1 illustrates an example of a structure 20 on a mask 10. Structure 20 is an example of an area of mask 10 that would block light from passing through mask 10 when used in a microlithography machine in manufacture if an IC.

Mask 10 may include more structures such as structure 20, however, for simplicity of explanation, only structure 20 is shown in FIG. 1. As is understood in the art, structure 20 is generated in mask 10 by an algorithm that directs transformations of datatypes in a database. In one embodiment, a database entry includes a layer and a set of coordinates that indicate the locations of starting points and endpoints for lines or curves of a shape or a set of shapes. Such databases are understood to those skilled in the art. The algorithm and database are created based on an original design drawing of mask 10.

To create a structure such as structure 20 from the database, the algorithm generally includes one or more identifiers to indicate a unique database entry set of entries. In one embodiment, the algorithm indicates an 'ordered pair' of numbers; the first number indicates a layer from which a shape (or shapes) of the structure is (are) to be taken. The second number is a data type indicating the specific shape and location (or subset of shapes and locations) from the indicated layer. For example, as part of the algorithm for creation of structure 20, the ordered pair (6;0) would indicate that the data type 0 from layer 6 is to be included in structure 20. This, for example, could be a square of a predetermined dimension at a predetermined location on mask 10. As is understood in the art, to facilitate this, the database would preferably include an entry for layer 6 and data type 0 that includes coordinates of start and endpoints of the four lines making up the square. Such database entries can be provided, for example, in GDS-II format, which is understood by those skilled in the art. It is also considered that the data base could use other methods for indicating that layer 6 data type 0 includes a square of a predetermined dimension at a predetermined location.

In one example, algorithm (1) for generating structure 20 appears below:

$$(6;0 \text{ or } 7;0) \text{ or } 8;0) \tag{1}$$

As discussed above, and as shown in FIG. 1 the ordered pair 6;0, in one example, indicates a square 12 (shown in phantom) of a predetermined dimension at a predetermined location on mask 10. In the example of FIG. 1, the ordered pair (7;0), indicating data type 0 of layer 7, represents a square 14 (shown in phantom) of the same dimension as square 12 but at a location that is shifted to the right of square 12. In the example of FIG. 1, the ordered pair (8;0) indicating a data type 0 of layer 8, represents a square 16 (shown in phantom) of a predetermined dimension that is larger than squares 12 and 14, and at a location that is shifted to the right of square 14. Algorithm (1) that generates structure 20 includes two logical 'OR' Boolean operators and three parenthesis. The first logical 'OR' operator in the first set of parenthesis indicates that structure 20 is to include the union of the area of square 12 and square 14. The second 'OR' operator within the third parenthesis indicates that the union of the area of square 12 and square 14 is to then be "unioned" with the area of square 16. As shown in FIG. 1, the resulting structure is structure 20 (shown in solid line). Creation of masks from a database and algorithm is preferably carried out by software that is part of a microlithography machine. Such software and machines are well known in the art.

Figure 2:
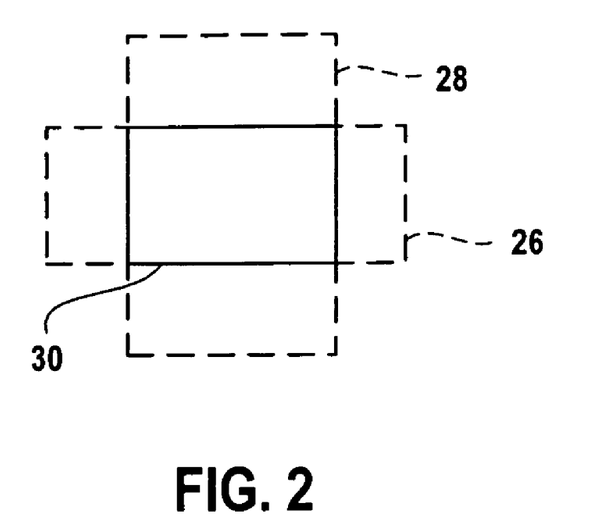
FIG. 2 is a block diagram illustrating the operation of an "AND" operator in a mask generation algorithm.

Algorithms for generating masks can also include logical 'AND' operators. For example, algorithm (2) below:

$$(6;20 \text{ and } 7;0) \tag{2}$$

could represent the structure 30 shown in FIG. 2. Specifically, in the example shown in FIG. 2, the 'layer; data type' ordered pair (6;20) indicates the rectangle 26 (shown in phantom) of a predetermined size and location and the 'layer; data type' ordered pair (7;0) indicates the rectangle 28 (shown in phantom) of a predetermined size and location. The logical 'AND' operator indicates that structure 30 (shown in solid line) is to include the intersection of the area of rectangle 26 and rectangle 28.

Figure 3:
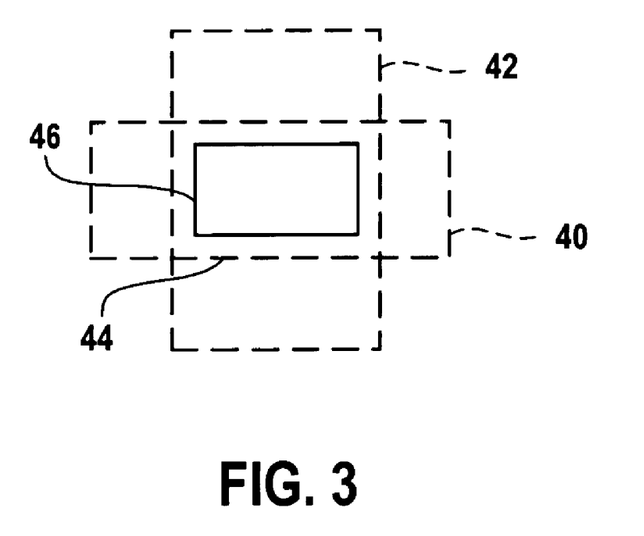
FIG. 3 is a block diagram illustrating the operation of an "AND" operator and a sizing operator in a mask generation algorithm.

Algorithms for generating masks can also include sizing information to indicate deviation from the size of a data object in the database. Below is an example of an algorithm (3) that could generate the structure illustrated in FIG. 3.

$$(6;0 \text{ and } 7;20) \text{ and sizing } -0.1 \tag{3}$$

In particular, the ordered pair (6;0) could indicate rectangle 40 (shown in phantom), and the ordered pair (7;20) could indicate square 42 (shown in phantom). The logical 'AND' operator in the first set of parenthesis indicates the intersection of the area of rectangle 40 and rectangle 42 which is rectangle 44 (shown in phantom). The phantom line do not appear in the shape ultimately rendered on the mask. The "and sizing −0.1" portion of the algorithm indicates that rectangle 44, the structure resulting from the "(6;0 and 7;20)" portion of the algorithm, is to be reduced in size by 0.1 units. Specifically, in the example of FIG. 3, each end of each line that is part of rectangle 44 is reduced in length by 0.1 units. Thus, the resulting structure is rectangle 46, which is smaller than rectangle 44 by 0.2 units in each direction.

As discussed above, manufacture of ICs involves building up IC layers (different from database layers) of materials on a substrate. It is typical for an IC to include from 25 to 45 such IC layers, though greater or fewer layers may be included. Additionally, manufacture of each IC layer can require use of a number of data types in the database. Thus, for example, an IC that includes 40 layers (and, thus, 40 masks) with each layer including 4 data types will generate 160 structures that must be checked against the original design drawings of the masks. As such, the task of checking a set of masks used to manufacture an IC in a microlithography machine against the design drawings of the masks in order to check the accuracy of the mask generation algorithm can be relatively time consuming. Further, when carrying out such checking, because the database itself is not examined, there is no way to know the position on a mask where each generated structure is located. This can add to the difficulty of completing such an algorithm check.

Figure 4:
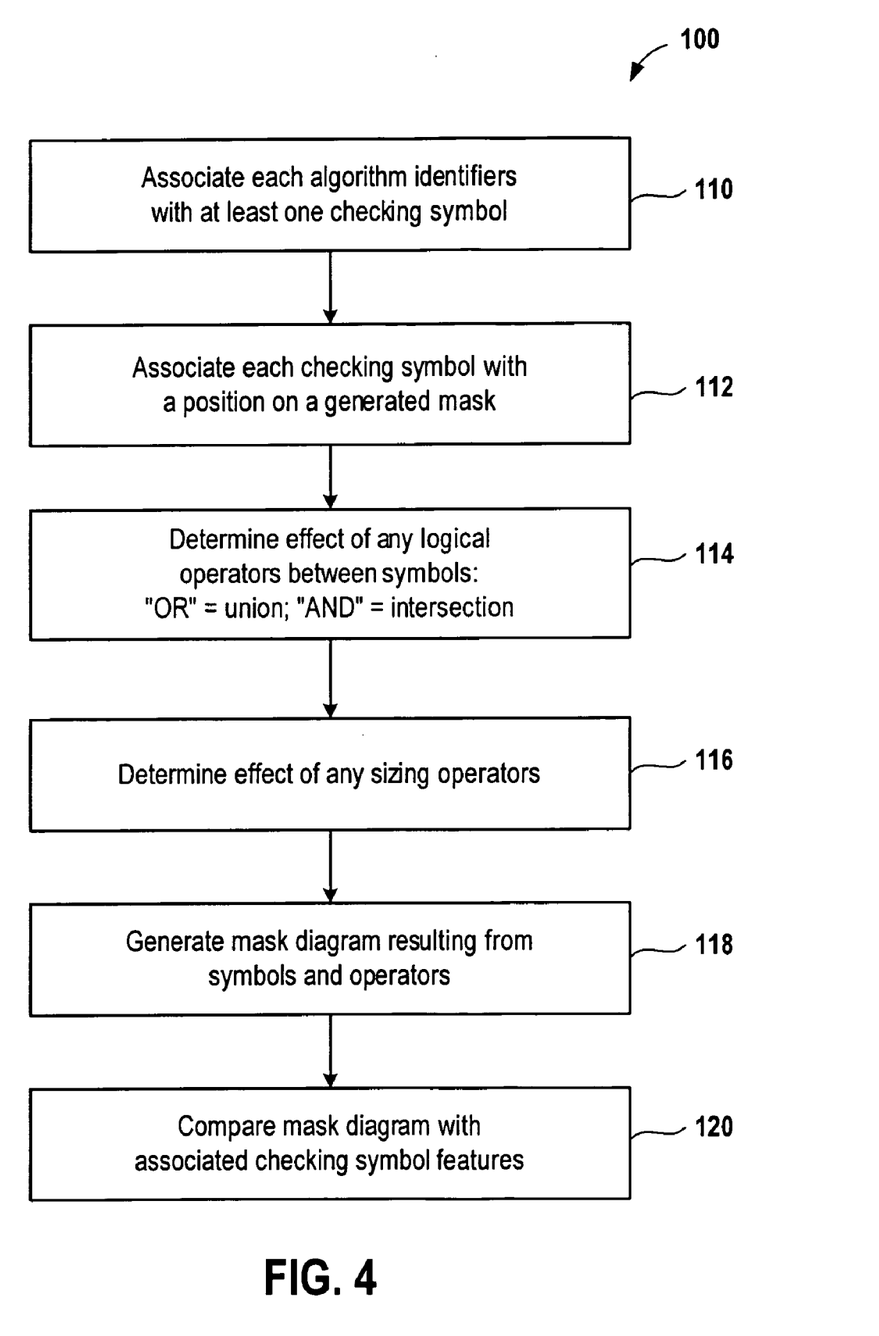
FIG. 4 is a flow chart showing a method for checking the operation of an IC mask generation algorithm in accordance with the present invention.

FIG. 4 illustrates a relatively time-efficient method 100 of checking the accuracy of an IC mask generation algorithm. In step 110, each identifier of the mask generation algorithm is associated with a checking symbol that is not associated with generating a functional IC feature. That is, the checking symbol is not related to generating a feature on an IC that carries out, or is associated with carrying out, an electrical or otherwise function of the IC. The checking symbol can be a filled in or outlined shape, such as a polygon or other geometric figure, or other graphic including, without limitation symbols such as letters or numbers.

The checking symbol may, but need not be, one of the shapes for creating an electrical IC feature that the data type of the ordered pair corresponds to in generation of the mask. For example, in an algorithm for a given mask in which the identifiers are ordered pairs as discussed above, the ordered pair (6;0) might generate a square of a predetermined dimension in the mask and that is used to create a IC feature having an electrical or other functional purpose. In step 110 of method 100, the checking symbol associated with the ordered pair identifier may either be a square of the same predetermined dimension as would be generated in the mask, or any other symbol. But in any event, as noted above, even if the checking symbol generated on the mask does match the shape associated with the ordered pair that is for the purpose of creating a functional feature on the IC, the checking symbol does not create a function feature on the IC. As such, each identifier of the algorithm will be associated with two symbols or shapes; a first symbol or shape for creating a mask feature that is associated with generating a functional IC feature and a second checking symbol, that is not associated with creating a functional IC feature. The two symbols may be, but need not be, the same.

In an embodiment in which the identifiers in an algorithm are ordered pairs as described above, each ordered pair identifier appearing in an algorithm on which method 100 is being carried out is associated with a checking symbol. Preferably, like ordered pairs of an algorithm are associated with like checking symbols. Preferably, step 110 is accomplished by adding to the database a checking symbol chosen to represent a particular ordered pair or other identifier to the layer and data type listed in the ordered pair. For example, if in step 110, the checking symbol for the ordered pair (6;0) is to be a square, then coordinates for that square are included in the database in association with layer 6 and data type 0. In this way, when the ordered pair is translated into a shape on the mask that is used to create an electrical feature of one of the layers of an IC, the checking symbol is also placed on the mask. As discussed above, the checking symbol is not associated with any electrical feature of the IC. Thus, as discussed in detail below, criteria for placement of the checking symbol on the mask is simply that the location of the checking symbol is known and convenient to the checker.

In step 112 of method 100, the checking symbol associated in step 110 with an indicator in the database such as an ordered pair is associated with a predetermined, known position on a mask generated by an algorithm to be checked using method 100. As discussed above, in one embodiment, a symbol is associated with a mask location in the database by designating coordinates for the symbol. In particular, each line forming a symbol to be translated onto a mask is designated in a database entry by starting coordinates and ending coordinates.

Preferably, the checking symbol is associated with a position on the mask that is not used to create electrical features on an IC. For example, referring again to FIG. 1, exemplary symbol 18 could be a checking symbol, or a portion of a checking symbol, for structure 20. Preferably, symbol 18 is associated on mask 10 with a predetermined location known to a person or machine that will use the mask to check the accuracy of the generation algorithm. In the example of FIG. 1, this location is in the lower left corner of mask 10. This position can be designated with relative precision using a set of coordinates. Prior to generating mask 10, this location should be known so that it can be readily found when checking the accuracy of algorithm (1), that generated structure 20.

Figure 5:
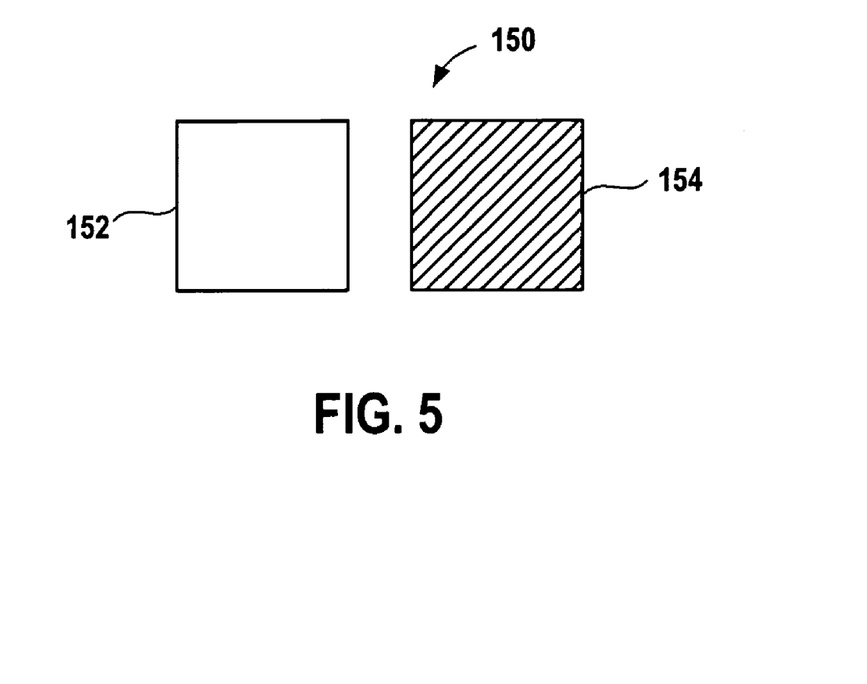
FIG. 5 is a block diagram showing an example of a checking diagram generated from a mask generation algorithm including an "OR" operator and that could be used to check the operation of the mask generation algorithm.

In step 114, the operators between ordered pairs in the algorithm are translated into a relationship between the symbols that ordered pairs or other identifier being operated on have been translated into. FIG. 5 illustrates an example of a diagram 150 that the algorithm portion (4):

$$(6;0 \text{ or } 7;0) \tag{4}$$

could be translated into in steps 110, 112, and 114 of method 100. In the example of FIG. 5, in carrying out step 110 of method 100, ordered pair (6;0) is associated with an outlined square 152, ordered pair (7;0) is associated with shaded square 154, and ordered pair (8;20) is associated with outlined rectangle 154. In carrying out step 114 of method 100, the logical "OR" operator between the first two terms represents the union of square 152 and 154. In diagram 150, this is shown by placing the two symbols represented by the "ORed" algorithm terms side by side. This is because in the example of FIG. 5, the coordinates of the database entries for square 152 and square 154 are designated such that squares 152 and 154 are located side by side on the mask. In the example of FIG. 5, step 114 is preferably carried out by the computer software that is reading algorithm (4) and rendering a mask therefrom. As noted above, such software is well understood in the art.

The translation illustrated in FIG. 5 is only one example of how steps 110, 112 and 114 of method 100 could be carried out. For example, any other symbol other than squares 152 and 154 could have been used to represent the respective ordered pairs. Also, different colored symbols may be used to represent respective ordered pairs.

It is also to be understood that even if the symbols used in method 100 do correspond to the data types that would be used as part of a generated mask to create functional features in an IC, the diagram generated by method 100 does not need to correspond to such a feature. For example, a mask feature generated by the algorithm may involve locations data types in a generated mask that cause the data types to overlap, rather than appear side by side.

In step 116 of method 100, the affect of any sizing instructions in the algorithm on checking diagram are determined. Algorithm (5) indicates a size translation to the intersection of two ordered pairs:

$$(7;20 \text{ and } 6;0) \text{ and size}=0.2 \tag{5}$$

Figure 6:
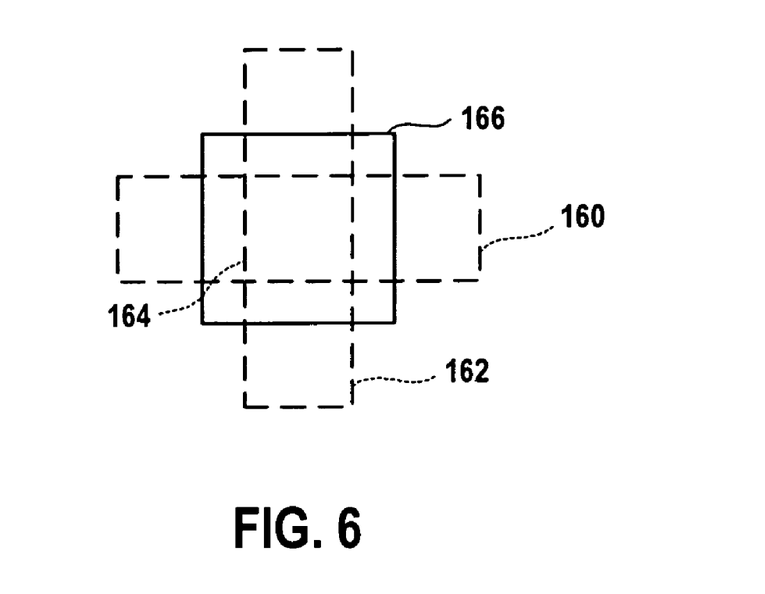
FIG. 6 is a block diagram illustrating an example of a checking diagram generated from a mask generation algorithm including an "AND" operation and a sizing operation and that could be used to check the operation of the mask generation algorithm.

FIG. 6 illustrates one example of a checking diagram that could be used to check algorithm (5). In FIG. 6, ordered pair (7;20) is represented by rectangle 160 (shown in phantom), ordered pair (6;0) is represented by rectangle 162 (shown in phantom) and the intersection of the two ordered pairs (the "AND" operator) is represented by square 164 (shown in phantom). The phantom lines are not translated to the checking diagram appearing on the mask. The "size=0.2" instruction of the algorithm includes a size operator. This instruction indicates that each end of each line forming square 164 is to be lengthened by 0.2 units. Thus, the final diagram that is translated to the mask is square 166, rectangles 160 and 162 and square 164 do not appear on the mask. To check that algorithm (5) was carried out correctly, either a person or machine scanner that is using the mask generated by algorithm (5) would need to measure square 166 to be sure it is the correct size. Specifically, that its dimensions are those of the intersection of rectangle 160 and rectangle 162 with each line forming such intersection increased in length by 0.2 units at each end. In the example of FIG. 6, step 116 is preferably carried out by the computer software that is reading algorithm (5) and rendering a mask therefrom. As noted above, such software is well understood in the art.

In step 118, the checking diagram developed by carrying out steps 110, 112, 114 and 116 is rendered on a mask. This step is carried out by rendering software in a microlithography machine and is well understood by those skilled in the art. Such microlithography machines including such rendering software are available from a number of commercial suppliers. For example, such machines are available from Nikon Inc. of Japan.

By determining diagrams from a mask generating algorithm in the manner described above, because each ordered pair, Boolean operator and sizing operation is translated into a diagram, the accuracy of the algorithm may be checked by analyzing the generated checking diagram. This analysis is carried out in step 120 of method 100. To analyze the diagrams for purposes of checking the accuracy of a mask generation algorithm, as discussed above, the shapes, location and effect of logical operations and sizing operations on checking symbols the diagram that a correct algorithm would generate is preferably determined prior to generating a mask with the algorithm. The shape, size and location of this predetermined diagram should match the shape, size and location of the checking diagram appearing on the mask. If the diagrams match, the algorithm is correct. If the diagrams do not match, then the algorithm should be checked for accuracy and any necessary correction.

In one embodiment, step 120 is carried out manually in a known manner. In another embodiment, because the exact shape size and location of a checking diagram for an algorithm is known, shape, size and location information can be provided to automated, or machine, checking software. The automated checking software can then perform an automated check for accuracy of the checking diagram. Such software and programming and operation thereof are well known in the art. For example, Design Rule Checker, available from Cadence® of San Jose, Calif. can be used for this purpose.

Though algorithms (1), (2), (3), (4) and (5) discussed above illustrate the various components which are generally included in mask generation algorithms that might be used for manufacture of an IC, for purposes of clarity, algorithms (1), (2), (3) and (5) are simplified from an actual such algorithm. Algorithm (6) below provides an example of an actual algorithm that might be used in the manufacture of an IC:

$$(((((((((((((17;0 \text{ OR } 17;70) \text{ AND } (((((6;0 \text{ OR } 7;0)$$
$$\text{OR } 8;0) \text{OR } 6;70) \text{ OR } 7;70)$$

$$\text{OR } 8;70), \text{SIZING } 0.02)) \text{ AND } ((15;0 \text{ OR } 15;70)$$
$$\text{OR } 15;90)) \text{ AND } ((26;0 \text{ OR } 26;70)$$

$$\text{OR } 26;90)) \text{ SIZING } 0.023) \text{ OR } (((((17;0 \text{ OR } 17;70)$$
$$\text{AND } (((((6;0 \text{ OR } 7;0) \text{ OR } 8;0)$$

$$\text{OR } 6;70) \text{ OR } 7;70) \text{ OR } 8;70) \text{ SIZING } 0.02)) \text{ AND}$$
$$((15;0 \text{ OR } 15;70) \text{ OR } 15;90)) \text{ AND}$$

$$((25;0 \text{ OR } 25;70) \text{ OR}$$

$$25;90)) \text{ SIZING } 0.021)) \text{ OR } (((17;0 \text{ OR } 17;70) \text{ AND}$$
$$((26;0 \text{ OR } 26;70)$$

$$\text{OR } 26;90)) \text{ SIZING } 0.002) \text{ OR } (((17;0 \text{ OR } 17;70)$$
$$\text{AND } ((25;0 \text{ OR } 25;70)$$

$$\text{OR } 25;90)) \text{ SIZING } 0.001)) \text{ OR}$$

$$((((17;0 \text{ OR } 17;70) \text{ AND } (50;0 \text{ OR } 50;90)) \text{ AND}$$
$$((26;0 \text{ OR } 26;70) \text{ OR } 26;90)) \text{ SIZING}$$

$$0.003)) \text{ OR } ((((17;0 \text{ OR } 17;70) \text{ AND } (50;0 \text{ OR}$$
$$50;90)) \text{ AND } ((25;0 \text{ OR } 25;70) \text{ OR } 25;90))$$

$$\text{SIZING } 0.001)) \text{ OR } (17;0 \text{ OR } 17;70)) \text{ SIZING}$$
$$0.001) \text{ SIZING } 0.04) \text{ SIZING } -0.04) \text{ OR}$$

$$((17;1 \text{ OR } 17;71) \text{ OR } 17;90)) \tag{6}$$

As can be seen from the number of ordered pairs in algorithm (6), a typical checking diagram would include more than just 2 or 3 individual symbols.

Figure 7:
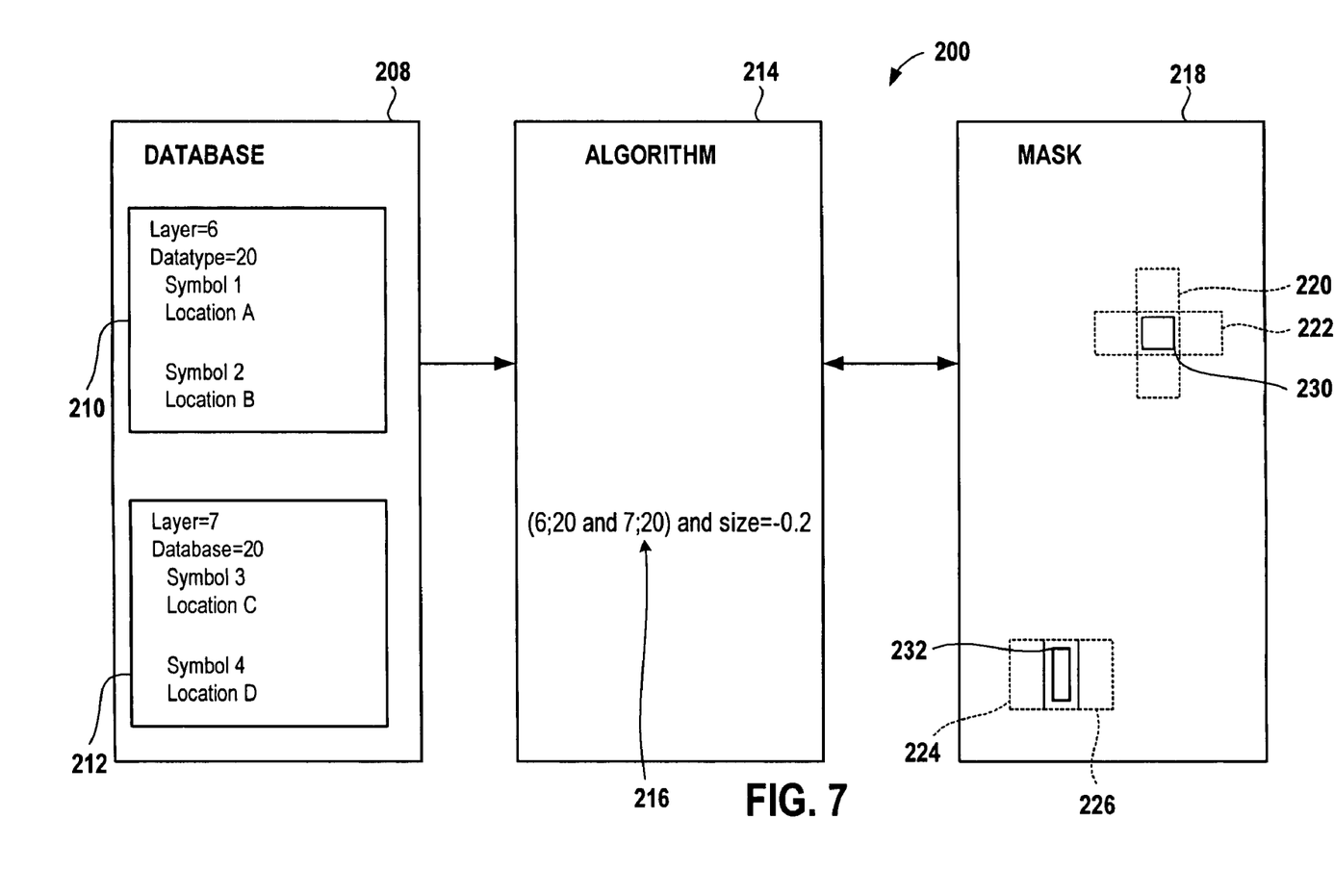
FIG. 7 is a block diagram of a system of checking the operation of a mask generation algorithm in accordance with the present invention.

FIG. 7 is a block diagram illustrating one embodiment of a system 100 for checking the operation of a generated IC mask. The example of FIG. 7 includes a database 208 including a first data entry 210 and a second data entry 212. System 200 also includes a mask generation algorithm 214 and IC generation mask 218. Mask generation algorithm 214 includes an algorithm terms 216. Mask 218 includes IC feature diagram 222 and checking diagram 232. When used to manufacture an IC, IC feature diagram 222 generates a functional feature (that is, a feature that carries out an electrical function), or portion thereof, on the manufactured IC. And, while checking diagram 232 may be transferred to mask 218, it will preferably not generate a functional feature, or portion thereof, on mask 218.

System 200 operates as described above in association with method 100. Algorithm terms 216 include a first ordered pair identifier (6;20) and second ordered pair identifier (7;20). Data entry 210 associates with the ordered pair identifying layer 6 and datatype 20 two symbols; symbol 1 and symbol 2. Preferably, symbol 1 indicates rectangle 220 (shown in phantom, phantom lines are not actually generated on mask 218) at least a portion of which makes up IC feature diagram 230. Data entry 210 also indicates that symbol 1 is positioned at location A on mask 218. Thus, rectangle 220 is positioned at location A on mask 218. Preferably, symbol 2 indicates square 226 (shown in phantom, phantom lines are not actually generated on mask 218) at least a portion of which makes up checking diagram 232. Data entry 210 also indicates that square 226 is positioned at location B on mask 218. As discussed above, symbols 1 and 2 at locations A and B, respectively, can be indicated in data entry 210 by providing coordinates of the endpoints of each line making up rectangle 220. Symbols 1 and 2 at locations A and B, respectively, can also be indicated in data entry 210 in any other manner.

Algorithm terms 216 also include ordered pair identifier (7;20). Data entry 212 of database 208 associates with this ordered pair identifying layer 7 and datatype 20 two symbols; symbol 3 positioned at location C on mask 218 and symbol 4 positioned at location D on mask 218. In the example of FIG. 7, symbol 3 is rectangle 222 (shown in phantom) making up a portion of IC feature diagram 230 and symbol 4 is square 224 making up a portion of checking diagram 232. The 'AND' logical operator of algorithm terms 216 indicates that the union of the symbols associated with ordered pairs (6;20) and (7;20) on either side of the 'AND' operator is to be generated on mask 218. Additionally, the "size" operator in algorithm terms 216 indicates that the union of the symbols associated with ordered pairs (6;20) and (7;20) is to be reduced in size by 0.2 units. Algorithm terms 216 of algorithm 214 in conjunction with data entries 210 and 212 of database 208 generate both an IC feature diagram 230 and checking diagram 232 on mask 218.

Because when manufacturing an IC, IC feature diagram 230 will likely be generated along with a number of IC feature diagrams, as discussed above, it can be relatively time consuming to check the accuracy of algorithm 214 by comparing the IC feature diagrams of mask 218 with the design drawings of mask 218. However, because checking diagram 232, along with any other checking diagrams generated by algorithm 214 in conjunction with database 208, can be systematically generated in predetermined locations on mask 218, checking the accuracy of algorithm 214 can be relatively more efficient. In particular, as discussed above, checking mask generation algorithm function in the prior art may require up to 1 to 2 weeks to complete in a typical manufacturing environment for an IC or family of ICs. This can mean significant delay in product rollout. It is believed that using a system and method in accordance with the present invention can reduce this amount of time to under a single day. As such, product rollout could be advantageously reduced.

Additionally, checking diagrams are preferably generated for all legal combinations of layers and data types which result in mask patterns. Accordingly, while in the prior art, it may have been too time consuming to check the operation of 100% of each algorithm that is used to manufacture an IC. However, because the checking system and method of the present invention is relatively less time consuming, it is possible to check the operation of 100% of each algorithm used to manufacture an IC or family of ICs.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method for checking operation of an integrated circuit ("IC") mask generation algorithm including:
    associating at least a first identifier of the IC mask generation algorithm with at least a first symbol, the first symbol not associated with generating a functional IC feature, the first symbol having a first predetermined size and a first predetermined shape;
    associating a first predetermined location on a mask with the first symbol;
    generating a mask diagram on the mask at least partially from the first symbol and at least partially at the first predetermined location; and
    comparing size and shape of the mask diagram with at least a portion of the first predetermined size and the first predetermined shape of the first symbol.

2. The method of claim 1 wherein said associating at least a first identifier of the IC mask generation algorithm with at least a first symbol includes associating data representing the first symbol with the first identifier in a database.

3. The method of claim 2 wherein said associating a first predetermined location includes associating data representing the first predetermined location with the first symbol in the database.

4. The method of claim 3 wherein the first identifier includes a first ordered pair of numbers, one of the numbers indicating a layer and another one of the numbers indicating a data type.

5. The method of claim 3 wherein the mask generation algorithm includes a second identifier and a logical operator between the first identifier and the second identifier and including:
    associating the second identifier of the IC mask generation algorithm with at least a second symbol, the second symbol not associated with generating a functional IC feature and having a second predetermined size and a second predetermined shape; and
    associating a second predetermined location on the mask with the second symbol.

6. The method of claim 5 wherein said generating a mask diagram includes:
    generating a mask diagram representing a union of the first symbol and the second symbol if the operator is a logical "OR" operator; and
    generating a mask diagram representing an intersection of the first symbol and the second symbol if the operator is a logical "AND" operator.

7. The method of claim 3 wherein:
    said generating a mask diagram includes altering the first predetermined size of the first symbol by associating a sizing operator with the first identifier in the IC mask generation algorithm, the sizing operator for altering the first predetermined size by a predetermined amount; and
    said comparing size and shape of the mask diagram includes said comparing the size and shape of the mask diagram as altered by the sizing operator with at least a portion of the first predetermined size and the first predetermined shape of the first symbol.

8. The method of claim 3 wherein said comparing size and shape of the mask diagram includes using software to compare the size and shape of the mask diagram with at least a portion of the first predetermined size and the first predetermined shape of the first symbol.

9. The method of claim 3 further including associating a second symbol with the first identifier, the second symbol for generating at least a portion of a IC feature diagram on the mask.

10. A system for checking operation of an integrated circuit ("IC") mask generation algorithm including:
    first database data representing a first symbol not associated with IC functionality;
    at least a first identifier in the IC mask generation algorithm, the first identifier associated with the first symbol; and
    a mask diagram generated by the IC mask generation algorithm at a first predetermined location on a mask from at least a portion of the first symbol, wherein a shape of at least a portion of the mask diagram is compared with shape of the first symbol.

11. The system of claim 10 wherein a size of at least a portion of the mask diagram is compared with a size of the first symbol.

12. The system of claim 10 wherein the first database data associates the first identifier with the first symbol.

13. The system of claim 12 wherein the first identifier includes an ordered pair of numbers, one of the numbers representing a layer and another one of the numbers representing a data type.

14. The system of claim 13 wherein:
    the IC mask generation algorithm includes a second identifier associated with a second symbol and an operator between the first identifier and the second identifier;
    the mask diagram represents a union of the first symbol and the second symbol if the operator is a logical "OR" operator; and
    the mask diagram represents an intersection of the first symbol and the second symbol if the operator is a logical "AND" operator.

15. The system of claim 12 wherein the IC mask generation algorithm includes a sizing operator that alters the size of the first symbol.

16. The system of claim 12 further including automated checking software for comparing a size and shape of at least a portion of the mask diagram with a size and shape of the first symbol.

17. The system of claim 12 further including:
    a second symbol associated with the first identifier; and
    an IC feature diagram generated by the IC mask generation algorithm at a second predetermined location on the mask from at least a portion of the second symbol, the IC feature diagram associated with a functional feature of the IC.

* * * * *